(12) United States Patent
Masuda (10) Patent No.: US 7,439,452 B2
(45) Date of Patent: Oct. 21, 2008

(54) MULTI-CHIP MODULE PACKAGING WITH THERMAL EXPANSION COEFFICIENCIES

(75) Inventor: Mitsuhiro Masuda, Chiyoda-ku (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/639,636

(22) Filed: Aug. 13, 2003

(65) Prior Publication Data
US 2004/0055783 A1  Mar. 25, 2004

(30) Foreign Application Priority Data
Sep. 3, 2002  (JP) .............................. 2002-257241

(51) Int. Cl.
*H01L 23/495* (2006.01)
(52) U.S. Cl. .................. 174/536; 174/520; 174/521; 174/527; 174/528; 174/529; 174/551
(58) Field of Classification Search ............... 174/52.2, 174/52.4, 520, 521, 526–529, 536, 551, 547–549, 174/538–540, 252
See application file for complete search history.

(56) References Cited

U.S. PATENT DOCUMENTS

| | | | | |
|---|---|---|---|---|
| 4,829,403 A * | 5/1989 | Harding | ...................... | 361/704 |
| 4,949,220 A * | 8/1990 | Tashiro | ...................... | 361/718 |
| 5,096,852 A | 3/1992 | Hobson | ...................... | 437/207 |
| 5,173,766 A * | 12/1992 | Long et al. | ................... | 257/687 |
| 5,367,196 A * | 11/1994 | Mahulikar et al. | .......... | 257/787 |
| 5,369,058 A | 11/1994 | Burns et al. | .................. | 437/209 |
| 5,552,631 A * | 9/1996 | McCormick | ................. | 257/666 |
| 5,932,345 A * | 8/1999 | Furutani et al. | .............. | 428/364 |
| 5,939,214 A * | 8/1999 | Mahulikar et al. | ........... | 428/626 |
| 5,958,100 A * | 9/1999 | Farnworth et al. | .............. | 65/47 |
| 6,197,615 B1 * | 3/2001 | Song et al. | ................... | 438/111 |
| 6,313,598 B1 * | 11/2001 | Tamba et al. | ................. | 318/722 |
| 6,346,743 B1 * | 2/2002 | Figueroa et al. | ............. | 257/723 |
| 6,437,240 B2 * | 8/2002 | Smith | ........................ | 174/52.2 |
| 6,492,202 B1 * | 12/2002 | Lober et al. | .................. | 438/122 |
| 6,492,204 B1 * | 12/2002 | Jacobs | ......................... | 438/127 |
| 6,909,185 B1 * | 6/2005 | Kondo et al. | ................. | 257/746 |
| 2003/0112568 A1 * | 6/2003 | Holt et al. | ................... | 361/91.1 |

FOREIGN PATENT DOCUMENTS

| | | |
|---|---|---|
| EP | 0 330 372 A2 | 2/1989 |
| JP | 6-61372 | 8/1992 |
| JP | 60041249 | 3/1998 |
| WO | WO 00/01060 A1 | 1/2000 |

OTHER PUBLICATIONS

European Office Action dated Jul. 5, 2006 (Four (4) pages).

* cited by examiner

*Primary Examiner*—Dean A. Reichard
*Assistant Examiner*—Hoa C Nguyen
(74) *Attorney, Agent, or Firm*—Crowell & Moring LLP

(57) ABSTRACT

In a transfer-mold configuration of an automotive electronic control unit, the thermal expansion coefficient of the circuit board is made apparently equal to that of the base member to suppress excessive stresses between them. The circuit board and the base member are placed in the center of the transfer-mold structure to make thermal stresses symmetrical and thus suppress strains.

4 Claims, 9 Drawing Sheets

MULTI-CHIP MODULE PACKAGING WITH THERMAL EXPANSION COEFFICIENCIES

BACKGROUND OF THE INVENTION

This invention relates to an automotive electronic control unit, particularly to a sealing structure of an electronic control circuit.

A conventional electronic control unit (hereinafter abbreviated as a control unit) for an engine or automatic transmission has been placed in the car interior. As the control unit grows bigger in the car interior, however, it has been requested that the control unit is placed outside the car interior. If the control unit is far away from objects to be controlled, wirings and connections become complicated and this increases the wiring cost. To improve this, it has been requested to integrate the control unit in the object to be controlled, more specifically, to make the control unit into a module.

In other words, it is necessary to place the control unit for the engine in the engine room or preferably on the engine body and similarly to place the control unit for the automatic transmission directly on the transmission body or inside the automatic transmission.

However, such places are in a severe temperature environment (−40 to 130° C.) and may be exposed to water, engine oil or AT oil (automatic transmission oil). Therefore, the control unit must be made by mounting electronic parts on a substrate having both heat resistant and heat-radiating characteristics such as a ceramic substrate and packaging them in a completely hermetic casing.

Judging from reliability and heat radiating ability, a metallic hermetic casing can be generally nominated, but it is hard to be adopted because of a high production cost. To solve this problem, Japanese Laid-Open Patent Publication No. Hei 06-61372 discloses, for example, a transfer-mold sealing structure which is a time-proven cheap and reliable semiconductor packaging technology.

SUMMARY OF THE INVENTION

However, the transfer-mold sealing structure of the above prior art is a laminated structure comprising a transfer-mold resin, a heat-resistant circuit board, and a heat-spreader member to assure heat radiation. The thermal expansion coefficient of epoxy resin suitable for transfer molding is 10 to 20 ppm/° C. The thermal expansion coefficient of a ceramic substrate suitable for heat-resistant high-density packaging is 5 to 7 ppm/° C. The thermal expansion coefficient of a copper alloy material as a high heat spreader is 16 to 18 ppm/° C.

These thermal expansion coefficients are greatly different from each other. Therefore, thermal stresses due to repetitive temperature transitions will break the adhesiveness of the sealed areas and, in extreme cases, will cause boundary delamination and resin cracks.

Figure 1:
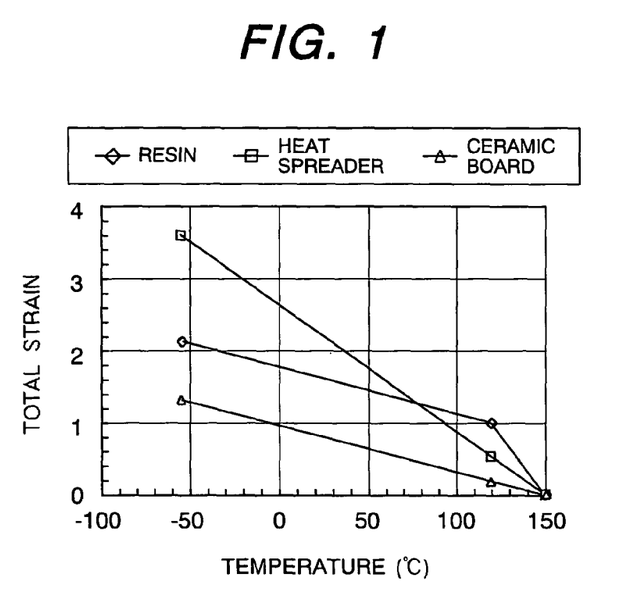
FIG. 1 shows thermal expansion coefficients of components of the transfer-mold sealing structure.

For example, referring to FIG. 1 which shows thermal expansion coefficients of components of the transfer-mold sealing structure, the thermal expansion coefficient of the resin changes dramatically at about a glass transition temperature.

Accordingly, in the high temperature range, the thermal expansion coefficient of the heat spreader is between the thermal expansion coefficients of the ceramic substrate and the resin. In the low temperature range, the thermal expansion coefficient of the resin is a little greater than that of the ceramic substrate and the thermal expansion coefficient of the heat spreader is high above those of the other materials.

From the above, we can assume that there are extremely complicated thermal stresses depending upon thermal conditions. Particularly, as the circuit board must be placed as close to the heat spreader as possible to cool it effectively, they are easily delaminated by a great thermal stresses due to a big difference between their thermal expansion coefficients.

To solve the above problems, the present invention is characterized by making thermal expansion coefficients of some members in the transfer-mold sealing structure apparently equal to each other, for example, making the thermal expansion coefficients of the circuit board and the base member equal to each other.

The present invention is also characterized in that the circuit board and the base member are located in the center of the transfer-mold sealing structure. Further, the present invention is characterized in that the thermal expansion coefficient of the sealing resin is made greater than the thermal expansion coefficients of the circuit board and the base member to cause a compressive stress of said resin on the internal members (the circuit board and the base member).

DESCRIPTION OF THE PREFERRED EMBODIMENTS

To solve the above problems, this invention has a transfer-mold sealing structure of suppressing the generation of an excessive stress for example between the circuit board and the base member among components of the structure by making their expansion coefficients apparently equal to each other. Further, this invention suppresses generation of strains and consequently prevents boundary delamination and resin cracks by placing thereof in the center of the transfer-mold sealing structure and making generation of thermal stresses symmetrical.

Furthermore, this invention is characterized by generation of compressive stresses of said resin onto internal components (e.g. the circuit board and the base member) and prevents boundary delamination by making the thermal expansion coefficient of the sealing resin greater than thermal expansion coefficients of the circuit board and the base member.

Figure 2:
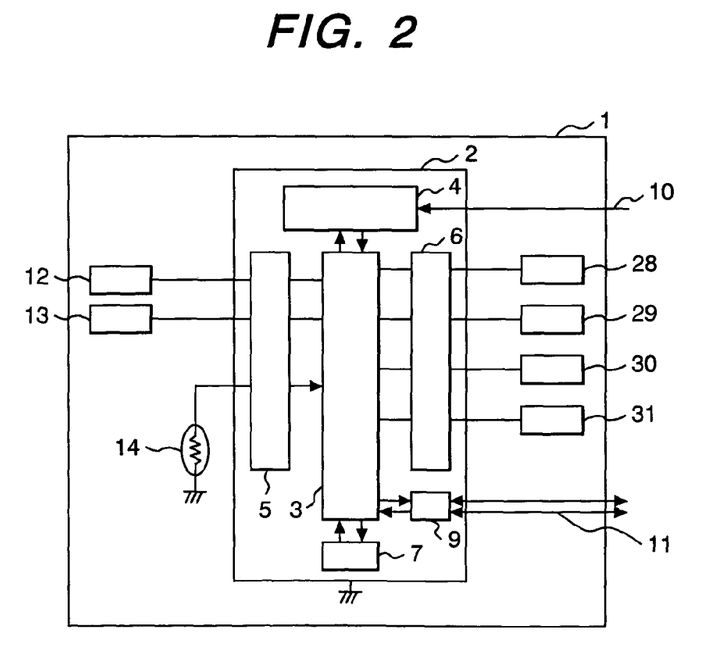
FIG. 2 is a block diagram of a system containing an electronic control unit for an automatic transmission which is the first embodiment of the present invention.

An automotive electronic control unit which is a preferred embodiment of the present invention is described below with reference to the accompanying drawings. FIG. 2 is a block diagram of a system containing an electronic control unit for an automatic transmission which is a first embodiment of the present invention.

Figure 3:
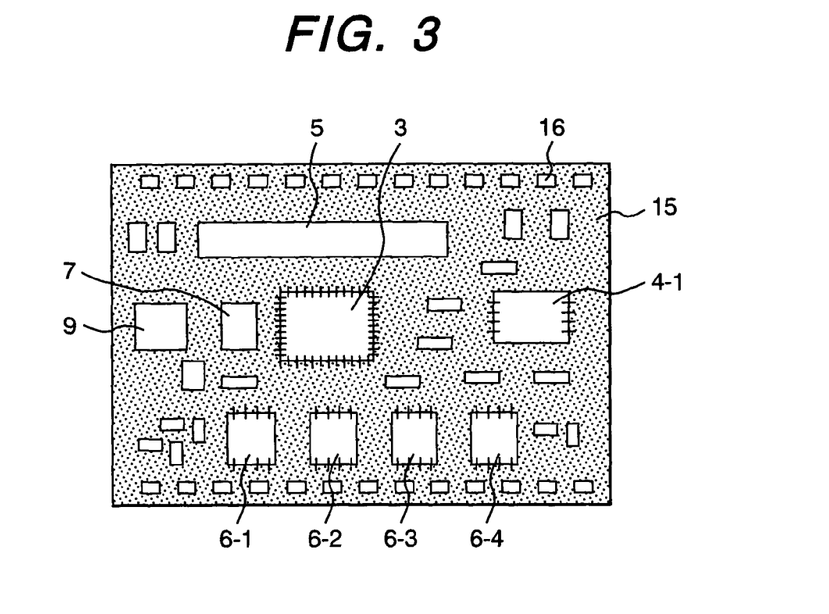
FIG. 3 shows a layout of electronic circuits of the first embodiment.
Figure 4:
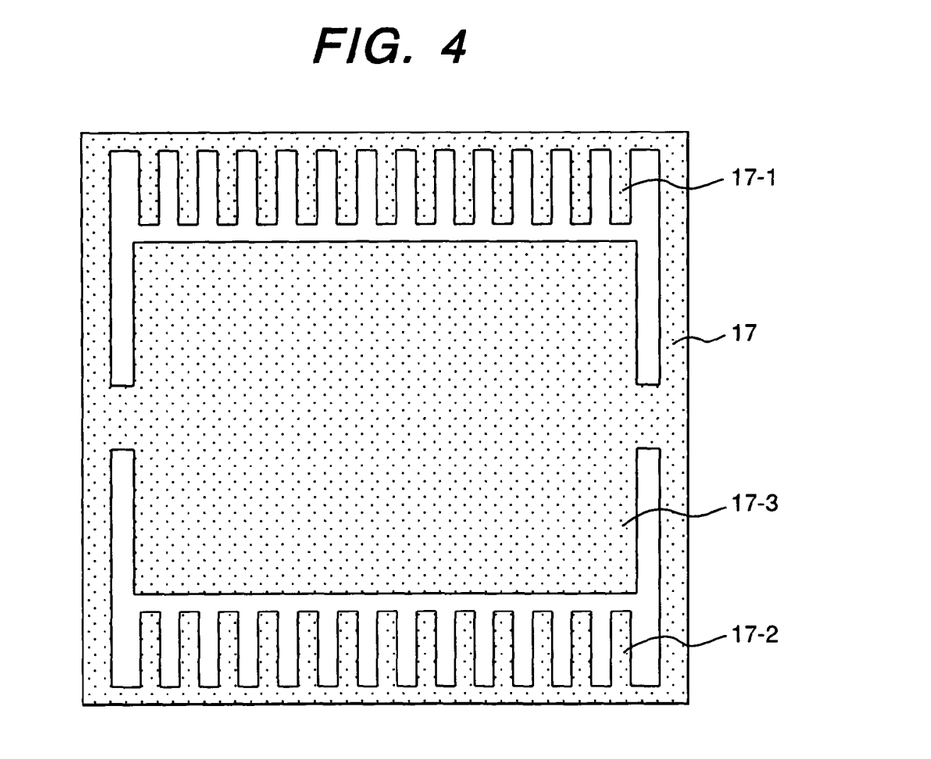
FIG. 4 shows the structure of a lead frame in the first embodiment.
Figure 5:
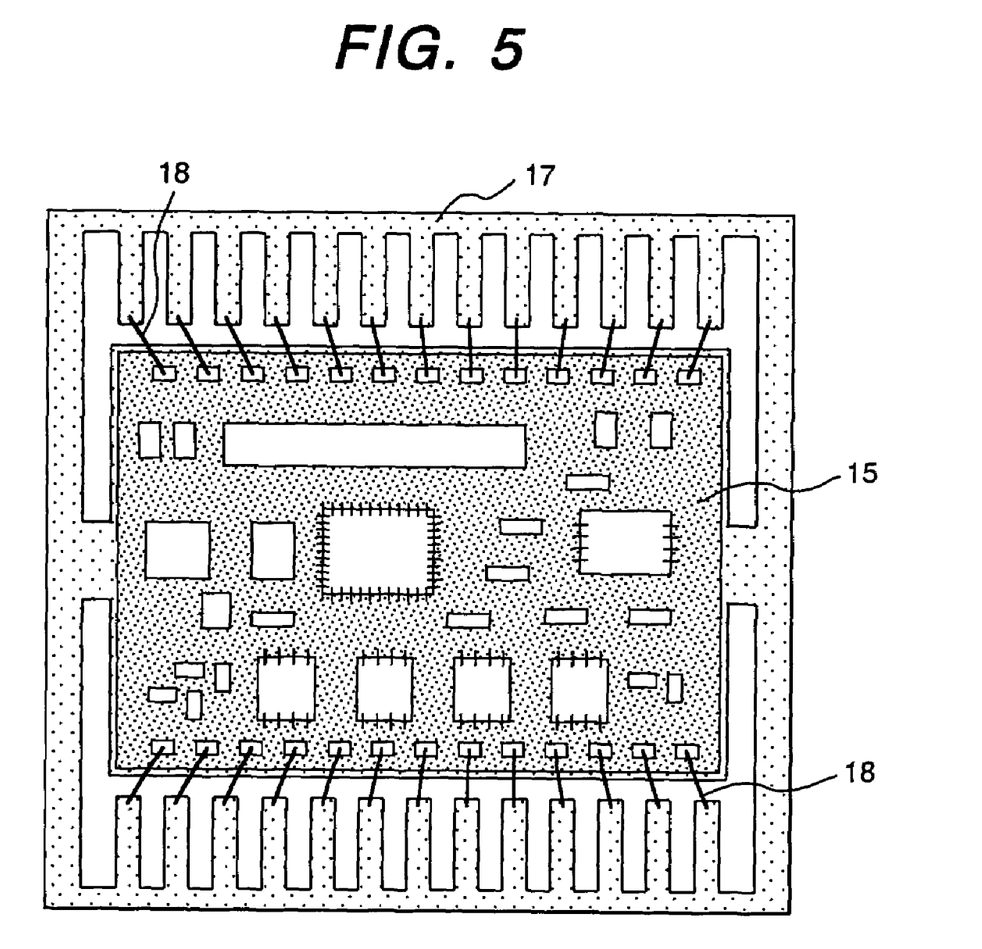
FIG. 5 shows the electronic circuit board on the lead frame in the first embodiment.
Figure 6:
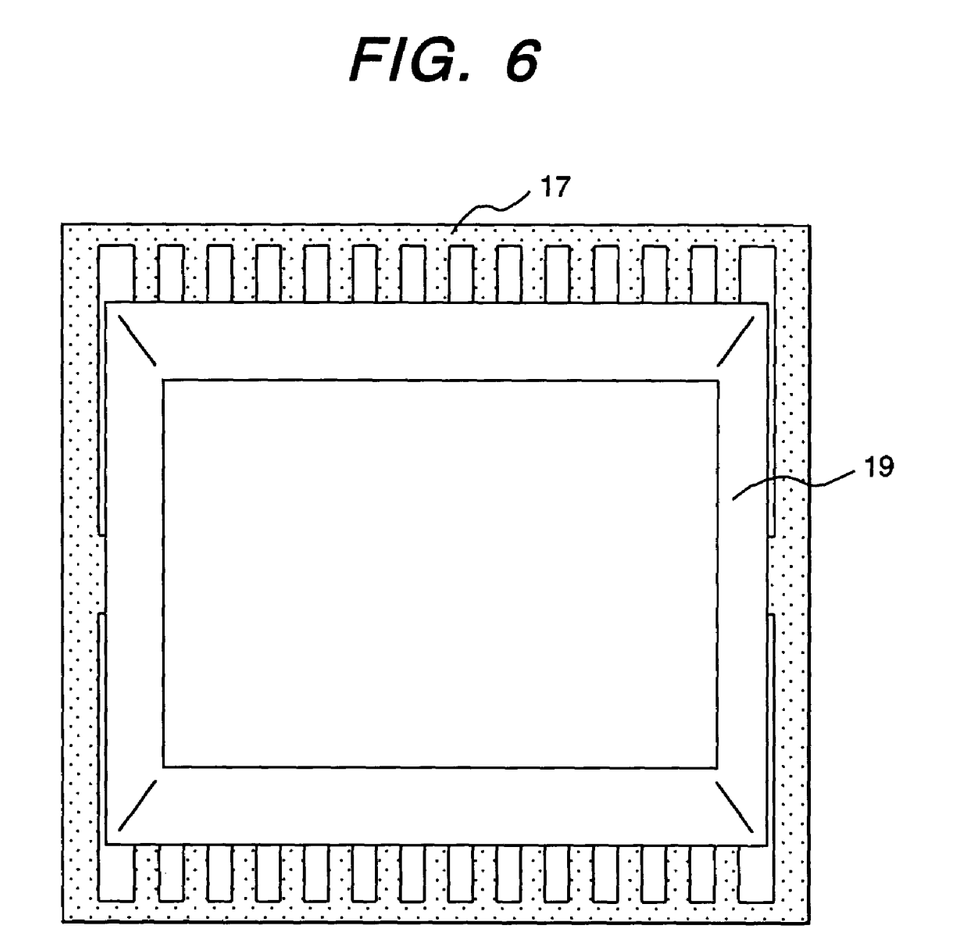
FIG. 6 shows a transfer-mold package of the electronic circuit board in the first embodiment.
Figure 7:
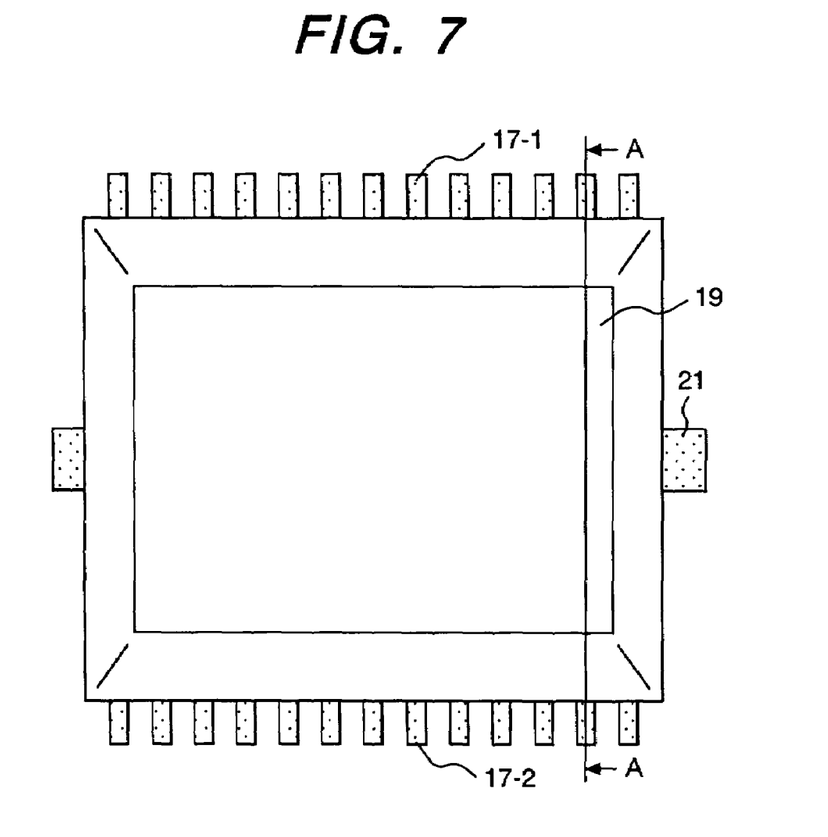
FIG. 7 shows an external view of the product which is post-processed after transfer-mold packaging.
Figure 8:
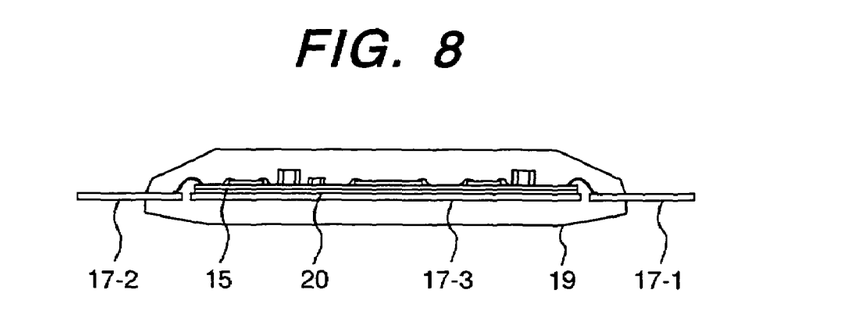
FIG. 8 is a cross-sectional view of the finished product of FIG. 7.

FIG. 3 shows a layout of electronic circuits of said electronic control unit on a circuit board. FIG. 4 shows the structure of a lead frame. FIG. 5 shows the electronic circuit board on the lead frame. FIG. 6 shows a transfer-mold package of the electronic circuit board of FIG. 5. FIG. 7 shows an external view of the product which is post-processed after transfer-mold packaging. FIG. 8 is a cross-sectional view of the finished product.

Figure 9:
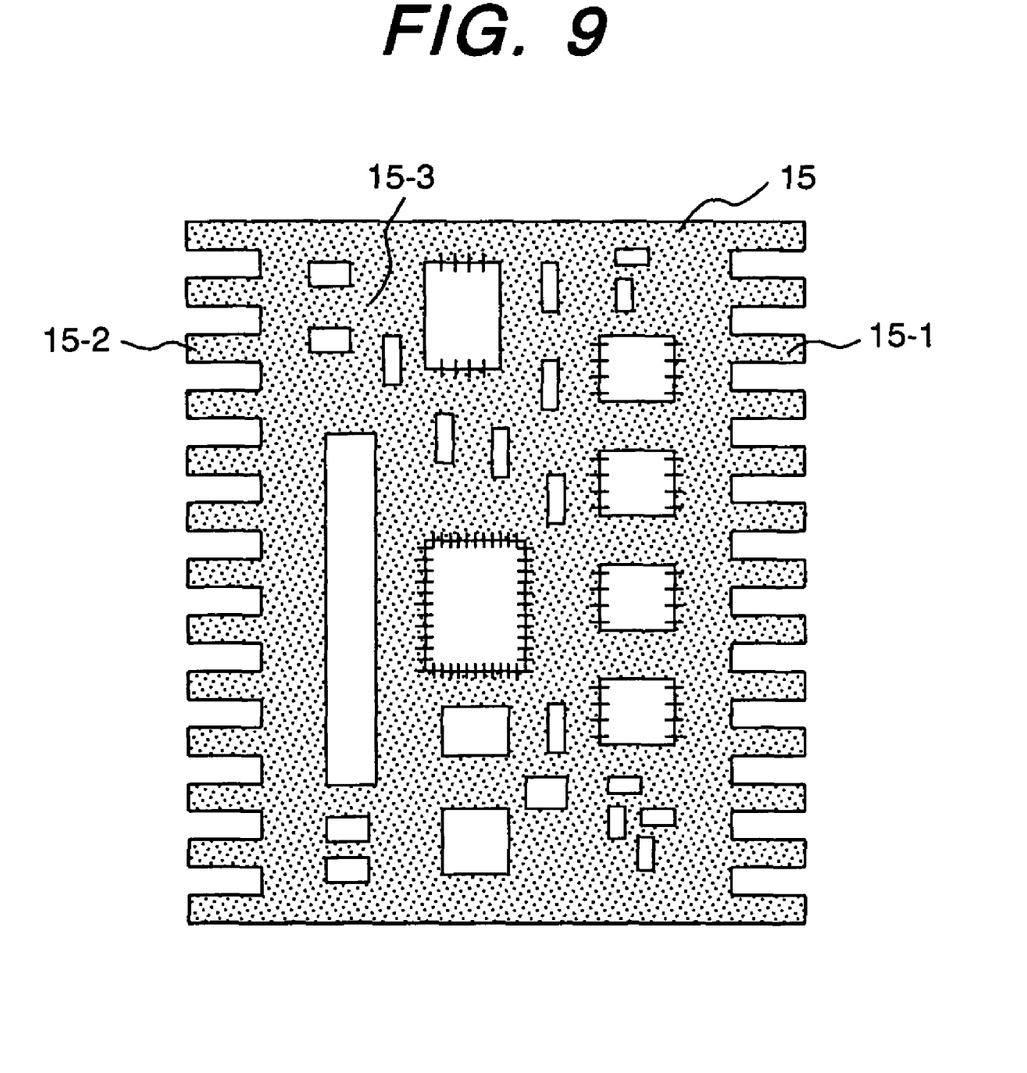
FIG. 9 shows a layout of electronic circuits on a circuit board in an electronic control unit which is the second embodiment of the present invention.
Figure 10:
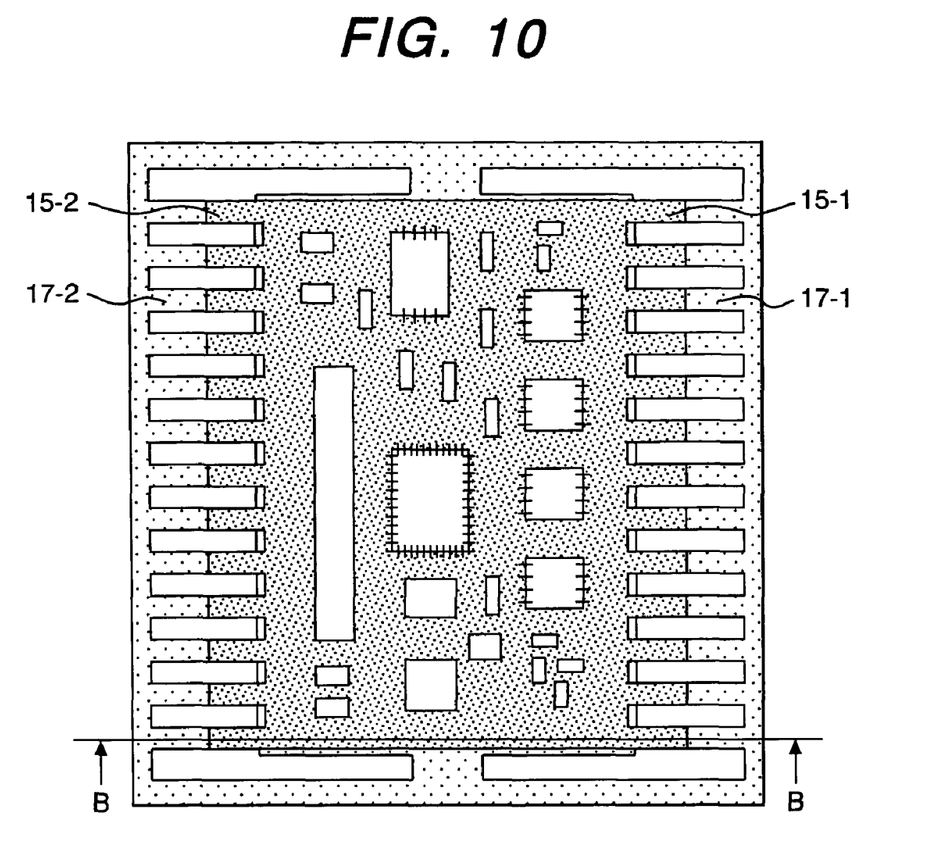
FIG. 10 shows the electronic circuit board mounted on the lead frame in the second embodiment.
Figure 11:
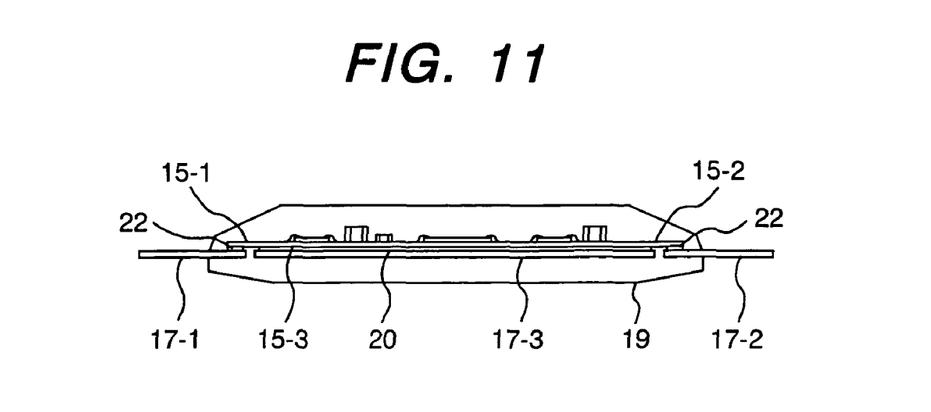
FIG. 11 shows a cross-sectional view of the electronic circuit board packaged by transfer-molding in the second embodiment.

FIG. 9 shows a layout of electronic circuits on a circuit board having means for connection to external connection pins in an electronic control unit which is a second embodiment of the present invention. FIG. 10 shows the electronic circuit board of FIG. 9 mounted on the lead frame. FIG. 11 shows a cross-sectional view of the electronic circuit board of FIG. 10 packaged by transfer-molding.

Figure 12:
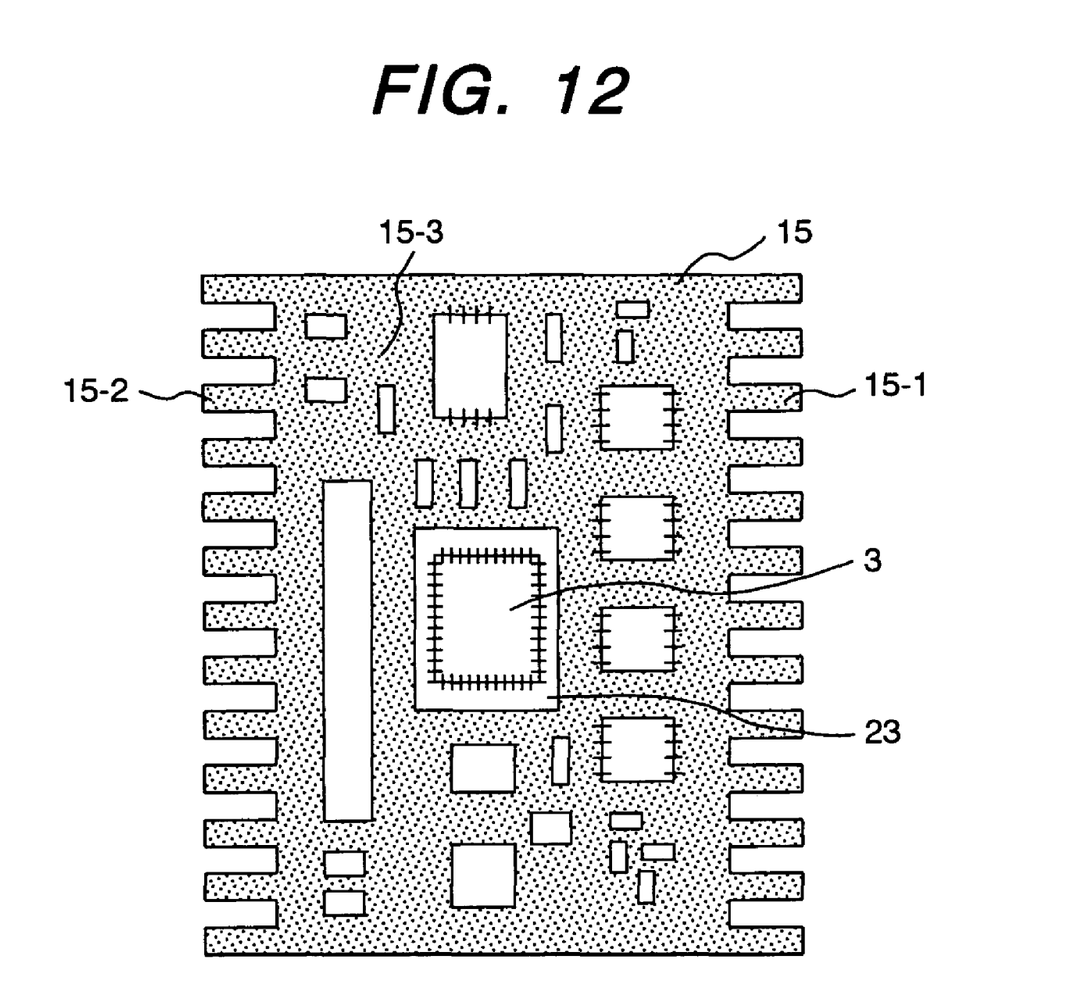
FIG. 12 shows a layout of electronic circuits in the third embodiment.
Figure 13:
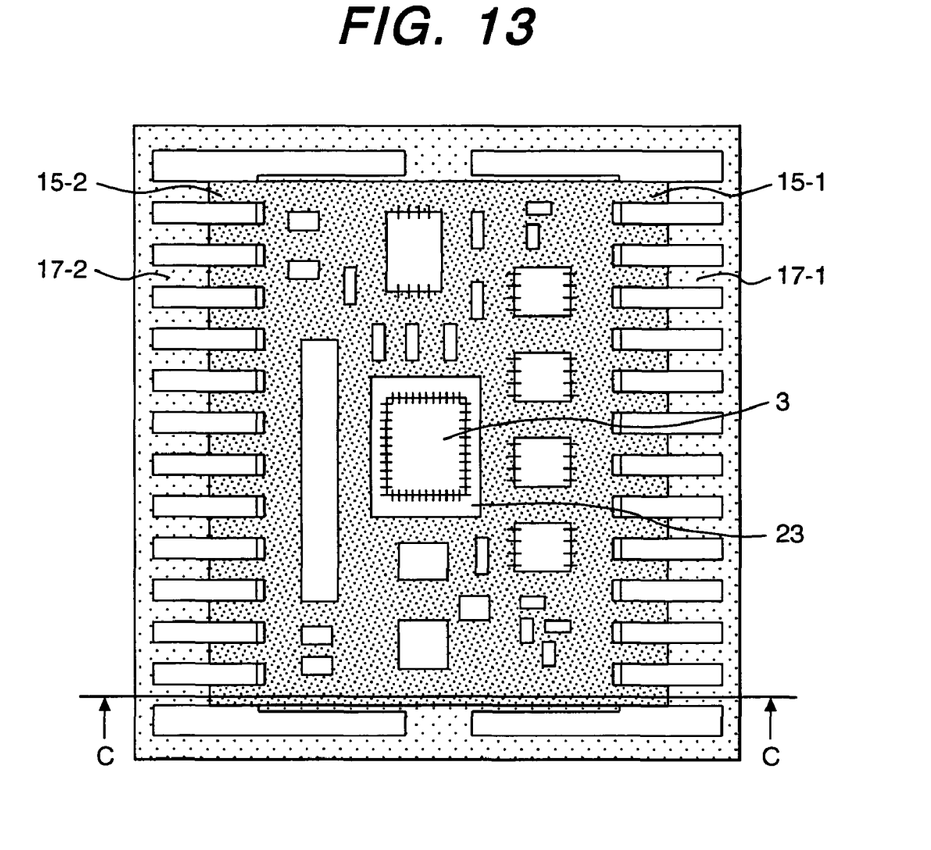
FIG. 13 shows the electronic circuit board mounted on the lead frame in the third embodiment.
Figure 14:
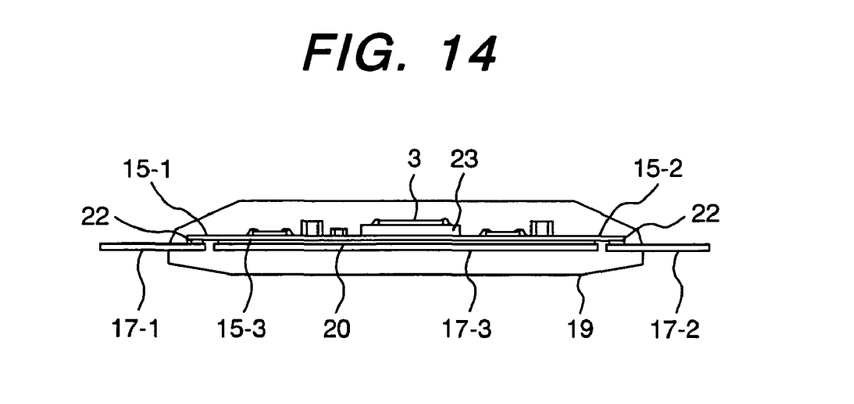
FIG. 14 shows a cross-sectional view of the electronic circuit board packaged by transfer-molding in the third embodiment.

FIG. 12 to FIG. 14 are for a third embodiment of this invention. FIG. 12 shows a layout of electronic circuits on the main circuit board which partially has subsidiary circuits thereon. FIG. 13 shows the electronic circuit board of FIG. 12 mounted on the lead frame. FIG. 14 shows a cross-sectional view of the electronic circuit board of FIG. 13 packaged by transfer-molding.

Referring to FIG. 2, the automatic transmission control system 1 contains an electronic control unit 2 for the automatic transmission, sensor switches, and solenoid valves. A battery power supply 10 cooperating with ignition keys (not shown in the drawing) and a CAN communication bus 11 are connected to said automatic transmission control system 1 from the outside of said automatic transmission control system 1.

Said battery power supply 10 is connected to said electronic control unit 2 for the automatic transmission. When the battery power supply 10 applies a voltage to the CPU 3 through a regulated voltage supply circuit 4, the oscillator 7 generates clocks. The electronic control unit 2 starts controlling according to programs pre-installed in said CPU 3.

The regulated voltage supply circuit 4 is equipped with a function to monitor the validity of execution of programs by the CPU 3, that is, a watch-dog function. When detecting an execution error of a program in the CPU 3, this function outputs a reset signal to the CPU 3 and performs other operations.

The input circuit 5 of the automatic transmission control system 1 contains a rotation sensor 12, a range selection switch 13, and an oil sensor 14 consisting of a thermistor. The CPU 3 receives signals from the input circuit 5, processes thereof, and sends signals to the output circuit 6 to control solenoids (shift solenoid A 28, shift solenoids B 29, line pressure solenoid 30, and lockup solenoid 31) so that the automatic transmission may be in an optimum running status.

The CPU 3 takes in an engine rotation signal and a throttle opening signal which are required for transmission control from the outside through The CAN communication bus 11 and the CAN communication drive circuit 9.

Referring to FIG. 3, below will be described a detailed layout of electronic circuits. This embodiment uses a flexible printed circuit board 15 as a circuit board. The flexible printed circuit board 15 is a laminated film containing a copper circuit pattern as the center layer. As its Young's modulus is extremely low, the flexible printed circuit board 15 can be attached to a high-rigidity base member to match its apparent thermal expansion coefficient to that of the base member.

As for the heat resistance thereof, polyester or polyimide materials can be used according to the environment in which this embodiment is used, but this embodiment uses a polyimide material as the control unit is sometimes used at a 120° C. or higher.

Judging effective heat radiation of components, the regulated voltage supply circuit 4 and the output circuit 6 are placed away from each other but arranged to flow signals smoothly on the flexible printed circuit board 15. More specifically, a bare power IC chip 4-1 which is a main element of the regulated voltage supply circuit 4 is mounted on the flexible printed circuit board 15 and connected to the peripherals by wire bonding.

Similarly, bare power IC chips 6-1, 6-2, 6-3, and 6-4 which are main elements of the output circuit 4 are mounted as close to the pins for outer connections as possible and connected to the peripherals by wire bonding. Further, the flexible printed circuit board 15 has the CPU 3, the oscillator 7, the CAN communication drive circuit 9, the input circuit 5, etc. thereon.

Bare IC chips are connected by wire bonding and other electronic parts are connected by reflow-soldering. Note, however, that the IC chips can be mounted in a flip-chip or package mounting method and that the reflow-soldering can be substituted with application of electro-conductive adhesive materials or the like.

Additionally, when aluminum wires are used to connect the flexible printed circuit board 15 to external connection pins, dedicated bonding pads 16 are provided on the outer edges of the flexible printed circuit board 15 for wire bonding.

FIG. 4 shows the structure of a lead frame 17 on which the flexible printed circuit board 15 is mounted.

Generally, the lead frame 17 is preferably made of a copper alloy material judging from the points of view of electric and thermal resistances. It can be substituted with a 42 alloy material to make the thermal expansion coefficient lower.

This embodiment uses a combination of pin sections 17-1 and 17-2 to connect the inside of the transfer mold to the outside and the base member 17-3 (hereinafter called an inner tab) to fix and cool the flexible printed circuit board 15. To increase the bonding ability of aluminum wires, the pin sections 17-1 and 17-2 are nickel-plated if necessary.

FIG. 5 shows the flexible printed circuit board 15 mounted on the lead frame 17 together with electronic components thereon. The backside of the flexible printed circuit board 15 is fixed to the inner tab 173 with an adhesive material (not shown in the drawing). The connection pins 17-1 and 17-2 of the lead frame 17 are connected to the flexible printed circuit board 15 by wire bonding. Here, aluminum wires 18 are used for wire bonding judging from current capacities and wire lengths.

FIG. 6 shows a transfer-mold package of the flexible printed circuit board 15 of FIG. 5. The flexible printed circuit board 15 is packaged with a transfer-mold resin. Here, epoxy thermosetting resin 19 is used as the transfer-mold resin.

Further, the flexible printed circuit board 15 is fully molded with the epoxy thermosetting resin 19 to assure air-tightness of the package.

In other words, the wire-bonding sections of the connection pins 17-1 and 17-2 of the lead frame are fully enveloped with the resin (not shown in the drawing). There should be enough creepage distance of insulation between the epoxy thermosetting resin 19 and the connection pins 17-1 and 17-2 as the bonded surfaces are closely related to the air-tightness. Further, the flexible printed circuit board 15 is placed in the center of the epoxy thermosetting resin 19. This structure can prevent partial thermal stresses.

FIG. 7 shows an external view of the product which is post-processed after transfer-mold packaging of FIG. 6.

The post-processing of the transfer-mold product comprises the steps of cutting out unwanted parts of the lead frame 17 (tiebar cutting) and removing molding burrs (deburring). In some cases, the connection pins 17-1 and 17-2 on the lead frame 17 which are exposed to the outside are properly plated to protect the pins against corrosion.

FIG. 7 shows surfaces 21 made by tiebar-cutting the inner tab 17-3 to fix and cool the flexible printed circuit board 15 in addition to the connection pins 17-1 and 17-2 for electrical connection. If the cooling performance is not enough for an application, it is possible to improve the cooling performance by extending and connecting the tiebar-cut portions 21 to means of high heat capacity.

FIG. 8 is a sectional view taken along a line A-A of FIG. 7. This figure shows that the epoxy thermosetting resin 19 envelops the electrical connection pins 17-1 and 17-2, the flexible printed circuit board 15 with electronic circuits thereon, and the inner tab 17-3 completely. The flexible printed circuit board 15 with electronic circuits thereon is bonded to the inner tab 17-3 with an adhesive material 20.

Usually, epoxy adhesive materials having strong adhesive forces are used as the adhesive material 20, but it is important that the adhesive material must be about 100 μm thick to assure heat radiation. An adhesive sheet can be used for easy adhesive thickness control.

The second embodiment of the present invention will be described below referring to FIG. 9 to FIG. 11. The second embodiment has the board edges having connections pins 17-1 and 17-2 extended in rectangles.

In FIG. 9, these rectangular portions 15-1 and 15-2 have copper foil patterns exposed on their backside so that they may be one-to-one connected directly to the mating connection pins 17-1 and 17-2. This does not require any bonding pad area 16 and consequentially can increase the component area 15-3.

FIG. 10 shows the flexible printed circuit board 15 mounted on the lead frame 17 together with electronic components thereon as well as the first embodiment. The rectangular portions 15-1 and 15-2 of the flexible printed circuit board 15 are arranged so that they may partially lap over the mating connection terminals 17-1 and 17-2. The electronic circuit areas 15-3 of the flexible printed circuit board 15 (not shown in the drawing) are fixed to the inner tab 17-3 with an adhesive material.

FIG. 11 shows a cross-sectional view of the transfer-mold package taken along the line B-B of FIG. 10. In this embodiment, the overlapped rectangular portions 15-1 and 15-2 of the flexible printed circuit board 15 are electrically connected to the mating connection pins 17-1 and 17-2 with solder 22. For some applications, these electrical connections can be made with an electro-conductive adhesive material.

The electronic circuit area 15-3 of the flexible printed circuit board 15-3 having electronic circuits is bonded to the inner tab 17-3 with an adhesive material 20 as well As in FIG. 8.

Although the conventional control units are forced to use wire bonding or the like to prevent stresses on electric connections due to temperature changes under actual conditions of use, this embodiment uses a flexible printed circuit board 15 of low Young's modulus. This enables direct connection to external connection pins.

The third embodiment will be described below referring to FIG. 12 to FIG. 14. This embodiment enables installation of more components that cannot be installed on the flexible printed circuit board 15 of FIG. 9 to FIG. 11. Although the flexible printed circuit board are for consumer use and generally inexpensive, polyimide heat-resistance multiplayer films of two or more layers as in this application will increase the production cost and is not economical. Therefore, the flexible printed circuit board 15 is basically allowed to have only two layers and partially to have three or more layers thereon for high-density packaging at a minimum cost.

FIG. 12 shows an example of using a multi-layer ceramic board 23 to connect the CPU 3 to the peripherals as a double-layer flexible printed circuit board 15 is impossible to connect the CPU 3 to the peripherals. A multi-layer ceramic board 23 is placed in the center of the flexible printed circuit board 15 of the same size as that in FIG. 9 and the CPU 3 is placed thereon.

In this embodiment, the CPU 3 is electrically connected to the multi-layer ceramic board 23 by wire bonding. Contrarily, the multi-layer ceramic board 23 is electrically connected to the flexible printed circuit board 15 by a known connection art such as a ball grid array (not shown in this drawing). This structure can minimize the influence of thermal stresses even when the multi-layer ceramic board 23 has a high Young's modulus and its thermal expansion coefficient is greatly different from that of the inner tab 17-3. It can be accomplished by placing the multi-layer ceramic board 23 locally in a place where the thermal strain is the smallest.

FIG. 13 shows the electronic circuit board of FIG. 12 mounted on the lead frame 17 together with electronic components thereon. As well as in FIG. 10, the rectangular portions 15-1 and 15-2 of the flexible printed circuit board 15 are arranged to be partially overlapped with the mating connection pins 17-1 and 17-2. The electronic circuit area 15-3 of the flexible printed circuit board 15 is bonded to the inner tab 17-3 with an adhesive material (not shown in the drawing).

FIG. 14 shows a cross-sectional view of the electronic circuit board of FIG. 13 packaged by transfer-molding which is taken along the line C-C. Also in this embodiment, the overlapped rectangular portions 15-1 and 15-2 of the flexible printed circuit board 15 are electrically connected to the mating connection pins 17-1 and 17-2 with solder 22. They can be electrically connected with electro-conductive adhesive material for some applications.

As well as in FIG. 11, the flexible printed circuit board 15-3 having electronic circuits thereon is bonded to the inner tab 17-3 with an adhesive material 20.

Similarly, the multi-layer ceramic board 23 is bonded to the flexible printed circuit board 15 with the similar adhesive material 20, (which is not shown in the drawing).

Although the thermal expansion coefficient of the epoxy thermosetting resin 19 for sealing the transfer-mold is not described in the above embodiments, it is preferable that the thermal expansion coefficient of the epoxy thermosetting resin is greater than the thermal expansion coefficient of the built-in circuit board and the inner tab as a whole. There are two reasons for this.

One reason is the thermal expansion coefficient of the epoxy thermosetting resin is greater in the lower temperature range and the thermal stress works to press The circuit board and the inner lead from the outside. This can prevent delamination of members. The other reason is that, in the higher temperature range, the Young's modulus of the epoxy thermosetting resin goes lower and no thermal stress generates to cause delamination although the case may be reversed in the higher temperature range.

Reference signs show the following parts:
1 . . . Automatic transmission control system, 2 . . . Electronic control unit for automatic transmission, 3 . . . CPU, 4 . . . Regulated voltage supply circuit, 4-1, 6-1, 6-2, 6-3, 6-4 . . . Power IC chips, 5 . . . Input circuit, 6 . . . Output circuit, 7 . . . Oscillator, 9 . . . CAN communication drive circuit, 10 . . . Battery power supply, 11 . . . CAN communication bus, 12 . . . Rotation sensor, 13 . . . Range selection switch, 14 . . . Oil temperature sensor, 15 . . . Flexible printed circuit board, 15-1, 15-2 . . . Rectangular portions of the flexible printed circuit board for outer connection, 15-3 . . . Electronic circuit mounting area of the flexible printed circuit board, 16 . . . Bonding pad, 17 . . . Lead frame, 17-1, 17-2 . . . Connection pins, 17-3 . . . Inner tab, 18 . . . Aluminum wire, 19 . . . Epoxy thermosetting resin, 20 . . . Adhesive material, 21 . . . Inner-tab tie bar cut, 22 . . . Solder, 23 . . . Multi-layer ceramic board, 28 . . . Shift solenoid A, 29 . . . Shift solenoid B, 30 . . . Line pressure solenoid, 31 . . . Lockup solenoid.

The present invention can provide a transfer-mold type electronic control device having both heat-radiating and delamination-resistant characteristics. Further, the present invention can minimize the increase of thermal stresses in high-density packaging by partially employing a high-density circuit board such as a multi-layer ceramic board and placing it in the center of the flexible board.

Furthermore, the present invention omit the process of bonding aluminum wires because the flexible printed circuit board can be connected to external connection pins with solder or electro-conductive adhesive materials.

What is claimed is:

1. An automotive electronic control unit comprising:
 a circuit board on which electronic parts constituting an electronic circuit are placed and which is provided with outwardly extending connecting portions;
 a base member, which is in contact with said circuit board for cooling thereof;
 a sealing resin mold which packages said electronic circuit, said circuit board, and said base member; and
 connection pins which are connected to said outwardly extending connection portions for external connection of said electronic circuit, through which connection pins said electronic circuit transfers signals to and from an outside of said control unit via said outwardly extended connecting portions; wherein,
 said electronic parts are situated on a first principal plane on a first side of said circuit board;
 said base member is in contact with substantially all of a second principal plane of said circuit board, on a second side of said circuit board which is opposite said first side;
 said connection pins are electrically connected to said circuit board; and
 said circuit board is securely fixed on said base member;
 said circuit board is composed of a material that is soft in comparison with said base member; and
 the outwardly extending connecting portions are in non-contact with the base member.

2. An automotive electronic control unit comprising:
 a circuit board on which electronic parts constituting an electronic circuit are placed and which is provided with outwardly extending connecting portions;
 a base member, which is in contact with said circuit board for cooling thereof;
 a sealing resin mold which packages said electronic circuit, said circuit board, and said base member; and
 connection pins which are connected to said outwardly extending connection portions for external connection of said electronic circuit, through which connection pins said electronic circuit transfers signals to and from an outside of said control unit via said outwardly extended connecting portions; wherein,
 said electronic parts are situated on a first principal plane on a first side of said circuit board;
 said base member is in contact with substantially all of a second principal plane of said circuit board, on a second side of said circuit board which is opposite said first side;
 said connection pins are electrically connected to said circuit board; and
 said circuit board is securely fixed on said base member;
 said circuit board is composed of a material that is soft in comparison with said base member; and
 said outwardly extending connecting portions extend beyond a periphery of said base member.

3. The automotive electronic control unit according to claim 2, wherein said connection pins overlap corresponding ones of said outwardly extending connecting portions.

4. The automotive electronic control unit according to claim 2, wherein said connection pins are connected to said outwardly extending connecting portions by a solder joint in an area of overlap between said connection pins and said outwardly extending connection portions.

* * * * *